US011508641B2

(12) United States Patent
Rowe

(10) Patent No.: US 11,508,641 B2
(45) Date of Patent: Nov. 22, 2022

(54) THERMALLY CONDUCTIVE AND ELECTRICALLY INSULATIVE MATERIAL

(71) Applicant: Toyota Motor Engineering & Manufacturing North America, Inc., Plano, TX (US)

(72) Inventor: Michael Paul Rowe, Pinckney, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 1 day.

(21) Appl. No.: 16/265,513

(22) Filed: Feb. 1, 2019

(65) Prior Publication Data
US 2020/0251399 A1 Aug. 6, 2020

(51) Int. Cl.
*B22F 7/02* (2006.01)
*H01L 23/373* (2006.01)
(Continued)

(52) U.S. Cl.
CPC ............ *H01L 23/3733* (2013.01); *B22F 3/24* (2013.01); *B22F 7/008* (2013.01); *B22F 7/02* (2013.01);
(Continued)

(58) Field of Classification Search
CPC ... H01L 23/36; H01L 23/367; H01L 23/3672; H01L 23/3731; H01L 23/3733;
(Continued)

(56) References Cited

U.S. PATENT DOCUMENTS 4,659,404 A * 4/1987 Butt ........................ B32B 15/01
257/E23.009
4,713,300 A * 12/1987 Sowman ............ B01J 20/28014
427/217
(Continued)

FOREIGN PATENT DOCUMENTS

DE 102013203664 A1 * 9/2014 ............ F21V 29/85
EP 2665092 A1 * 11/2013 ........... H01L 23/373
JP 2002203899 A 7/2002

OTHER PUBLICATIONS

Machine translation of DE 10 2013 203664 A1, obtained from EspaceNet (Year: 2020).*
(Continued)

*Primary Examiner* — Z. Jim Yang
(74) *Attorney, Agent, or Firm* — Christopher G. Darrow; Darrow Mustafa PC

(57) ABSTRACT

A monolithic substrate including a silica material fused to bulk copper is provided for coupling with electronic components, along with methods for making the same. The method includes arranging a base mixture in a die mold. The base mixture includes a bottom portion with copper micron powder and an upper portion with copper nanoparticles. The method includes arranging a secondary mixture on the upper portion of the base mixture. The secondary mixture includes a bottom portion with silica-coated copper nanoparticles and an upper portion with silica nanoparticles. The method includes heating and compressing the base mixture and the secondary mixture in the die mold at a temperature, pressure, and time sufficient to sinter and fuse the base mixture with the secondary mixture to form a monolithic substrate. The resulting monolithic substrate defines a first major surface providing thermal conductivity, and a second major surface providing an electrically resistive surface.

9 Claims, 4 Drawing Sheets

(51) Int. Cl.
  *B22F 7/00*    (2006.01)
  *B22F 3/24*    (2006.01)
  *H01L 21/48*   (2006.01)
  *F28F 21/04*   (2006.01)
  *F28F 21/08*   (2006.01)
  *H05K 3/00*    (2006.01)

(52) U.S. Cl.
  CPC .......... *F28F 21/04* (2013.01); *F28F 21/085* (2013.01); *H01L 21/4882* (2013.01); *H05K 3/0014* (2013.01); *B22F 2003/247* (2013.01); *B22F 2301/10* (2013.01); *B22F 2302/256* (2013.01); *F28F 2255/06* (2013.01); *F28F 2255/18* (2013.01)

(58) Field of Classification Search
  CPC . H01L 23/3735; H01L 23/3736; B32B 18/00; C04B 2237/40; B22F 2207/01–05; B23B 1/008
  See application file for complete search history.

(56) References Cited

U.S. PATENT DOCUMENTS

| | | | | |
|---|---|---|---|---|
| 5,240,672 A * | 8/1993 | Yang | ............... | B22D 19/14 |
| | | | | 164/101 |
| 6,554,882 B1 * | 4/2003 | Zhou | ............... | B22F 3/22 |
| | | | | 264/610 |
| 6,582,763 B1 * | 6/2003 | Nishimura | ............... | B22F 1/16 |
| | | | | 427/576 |
| 6,677,679 B1 | 1/2004 | You et al. | | |
| 6,849,342 B1 * | 2/2005 | Stenzel | ............... | C22C 1/1036 |
| | | | | 428/701 |
| 10,682,699 B2 * | 6/2020 | Martin | ............... | B29C 64/153 |
| 2007/0057364 A1 * | 3/2007 | Wang | ............... | H01L 33/642 |
| | | | | 257/701 |
| 2008/0043444 A1 * | 2/2008 | Hasegawa | ............... | H01L 33/642 |
| | | | | 361/717 |
| 2008/0254309 A1 * | 10/2008 | Tomes | ............... | C22C 1/1068 |
| | | | | 428/548 |
| 2009/0039366 A1 * | 2/2009 | Chiu | ............... | H01L 33/64 |
| | | | | 257/E33.068 |
| 2009/0087644 A1 * | 4/2009 | Supriya | ............... | H01L 23/3735 |
| | | | | 428/327 |
| 2010/0035081 A1 * | 2/2010 | Clasen | ............... | C23C 18/127 |
| | | | | 428/650 |
| 2010/0089620 A1 * | 4/2010 | Matz | ............... | H05K 3/0061 |
| | | | | 204/192.15 |
| 2010/0282459 A1 * | 11/2010 | Leonhardt | ............... | C04B 41/51 |
| | | | | 165/185 |
| 2013/0216848 A1 * | 8/2013 | Kalich | ............... | H05K 1/0271 |
| | | | | 228/248.1 |
| 2014/0084182 A1 * | 3/2014 | Kim | ............... | H01L 33/38 |
| | | | | 250/492.1 |
| 2016/0002110 A1 * | 1/2016 | Izumi | ............... | C04B 35/12 |
| | | | | 156/89.28 |
| 2016/0002438 A1 * | 1/2016 | Yuan | ............... | B01J 23/50 |
| | | | | 524/612 |
| 2016/0035490 A1 * | 2/2016 | Tsuru | ............... | H01G 4/0085 |
| | | | | 252/514 |
| 2016/0049350 A1 * | 2/2016 | Matsuda | ............... | H01L 23/3736 |
| | | | | 165/185 |
| 2016/0096341 A1 * | 4/2016 | Izumi | ............... | B32B 9/005 |
| | | | | 174/126.1 |
| 2016/0096342 A1 * | 4/2016 | Izumi | ............... | B32B 3/12 |
| | | | | 428/116 |
| 2016/0219693 A1 * | 7/2016 | Nishimoto | ............... | H05K 3/248 |
| 2016/0250612 A1 * | 9/2016 | Oldenburg | ............... | C01B 33/113 |
| | | | | 428/404 |
| 2016/0271698 A1 * | 9/2016 | Schmidt | ............... | B22F 7/02 |
| 2016/0309585 A1 * | 10/2016 | Nakamura | ............... | H05K 3/4038 |
| 2017/0181279 A1 | 6/2017 | Koike et al. | | |
| 2017/0306170 A1 * | 10/2017 | Leamon | ............... | B82Y 40/00 |
| 2017/0361600 A1 * | 12/2017 | Bandyopadhyay | .... | B33Y 40/00 |
| 2018/0075952 A1 * | 3/2018 | Troetzschel | ............... | B22F 7/062 |
| 2018/0133789 A1 * | 5/2018 | Martin | ............... | C22C 1/1036 |
| 2018/0200989 A1 * | 7/2018 | Meyer | ............... | C25D 11/04 |
| 2018/0229299 A1 * | 8/2018 | Crane | ............... | B01J 35/0006 |
| 2018/0308820 A1 * | 10/2018 | Joshi | ............... | H01L 24/32 |
| 2019/0111480 A1 * | 4/2019 | Barbati | ............... | B29C 64/165 |
| 2019/0164760 A1 * | 5/2019 | Joshi | ............... | H01L 24/00 |
| 2019/0217384 A1 * | 7/2019 | Enomura | ............... | C09C 1/24 |
| 2019/0233947 A1 * | 8/2019 | Sublemontier | ....... | C23C 24/082 |
| 2019/0351576 A1 * | 11/2019 | Ishida | ............... | B29C 64/112 |
| 2020/0049415 A1 * | 2/2020 | Schiffres | ............... | H01L 21/283 |
| 2020/0269315 A1 * | 8/2020 | Dobashi | ............... | H01B 5/00 |
| 2021/0094094 A1 * | 4/2021 | Reikher | ............... | F16D 69/027 |
| 2021/0324913 A1 * | 10/2021 | Izawa | ............... | C22C 1/0425 |

OTHER PUBLICATIONS

Li, W., et al., "SiO2-like film deposition on copper surface by atmospheric pressure diffuse discharge," Plasma Science (ICOPS) IEEE Xplore Digital Library, Accession No. 16211664; DOI: 10.1109/PLASMA.2016.7534005 (2016) abstract only, 1 page.

\* cited by examiner

THERMALLY CONDUCTIVE AND ELECTRICALLY INSULATIVE MATERIAL

TECHNICAL FIELD

The present disclosure generally relates to substrates for coupling with electronic components and, more particularly, to monolithic substrates with an electrically insulating surface bonded to copper.

BACKGROUND

The background description provided herein is for the purpose of generally presenting the context of the disclosure. Work of the presently named inventors, to the extent it may be described in this background section, as well as aspects of the description that may not otherwise qualify as prior art at the time of filing, are neither expressly nor impliedly admitted as prior art against the present technology.

Quality electronic components typically exhibit dynamic durability and provide reliable electrical insulation. Certain electronic components, such as semiconductor devices, commonly need to be mounted to surfaces that are both electrically resistive, to keep electronic circuits from shorting, and thermally conductive, to keep the electronic components from overheating. However, electrical resistivity is usually associated with thermal insulators, and thermally conductive materials are usually electrical conductors. Thus, many conventional substrates for use with electronic components are formed using multiple layers and with relatively complex designs to accomplish these goals. When multiple layers are used, however, there is a potential for delamination, ultimately depending on the materials, design, and end use. By way of example, a quality adhesion of copper to an inorganic material is often difficult to obtain. Still further, each additional layer may lead to increased production time and increased costs.

Accordingly, it would be desirable to provide an improved and cost effective substrate that prevents electrical shorting across a surface, while maintaining a superior thermal conductivity.

SUMMARY

This section provides a general summary of the disclosure, and is not a comprehensive disclosure of its full scope or all of its features.

In various aspects, the present teachings provide a monolithic substrate for coupling with an electronic component. The monolithic substrate includes a first region defining a first major surface comprising copper. The monolithic substrate includes a second region having a silica based inorganic material and defining an electrically resistive second major surface. The first and second regions are sintered and fused with one another to form the monolithic substrate. In various aspects, the second major surface of the second region includes $SiO_2$.

In other aspects, the present teachings provide a method for making a monolithic substrate including a silica based inorganic material fused to copper. The method includes arranging a base mixture including copper nanoparticles in a die mold. The method includes arranging a secondary mixture including silica nanoparticles on top of the base mixture. The method further includes heating and compressing the base mixture and the secondary mixture in the die mold at a temperature, a pressure, and a time sufficient to sinter and fuse the base mixture with the secondary mixture to form a monolithic substrate defining a first major surface providing thermal conductivity, and a second major surface providing an electrically resistive surface.

In still other aspects, the present teachings provide a method for making a monolithic substrate including a silica material fused to copper. The method includes arranging a base mixture in a die mold. The base mixture includes a bottom portion with copper micron powder and an upper portion with copper nanoparticles. The method includes arranging a secondary mixture on the upper portion of the base mixture. The secondary mixture includes a bottom portion with silica-coated copper nanoparticles and an upper portion with silica nanoparticles. The method includes heating and compressing the base mixture and the secondary mixture in the die mold at a temperature, a pressure, and a time sufficient to sinter and fuse the base mixture with the secondary mixture to form a monolithic substrate. The resulting monolithic substrate defines a first major surface providing thermal conductivity, and a second major surface providing an electrically resistive surface.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

It should be noted that the figures set forth herein are intended to exemplify the general characteristics of the methods, algorithms, and devices among those of the present technology, for the purpose of the description of certain aspects. These figures may not precisely reflect the characteristics of any given aspect, and are not necessarily intended to define or limit specific embodiments within the scope of this technology. Further, certain aspects may incorporate features from a combination of figures.

DETAILED DESCRIPTION

The present technology generally provides a monolithic substrate for coupling with electronic components that provides an electrically insulating surface while also being highly thermally conductive. In various aspects, the methods of the present technology successfully bond a silica based inorganic material to bulk copper. Notably, neither molten copper and silica, nor any molten and cool combination of copper and silica, will typically bond to one another. While it is known to use vapor deposition techniques to couple such materials, those techniques are often complex, mechanically very delicate and may not be cost effective. The methods provided herein allow for the union of these two previously non-joining materials. Conventional substrates must use multiple layers and complex designs to achieve similar results that the present technology provides with a monolithic component design.

As will be described in more detail below, the methods according to the present technology provide for making a substrate, particularly a monolithic substrate, including a silica based inorganic material fused to copper. As used herein, the term "monolithic" means a single, solid component that is intractably indivisible once formed. While there may be an interface region where two or more components are joined together by bonding or some type of fusion, once the materials are bonded/fused to one another, the materials do not typically separate from one another as may occur in other layered substrates.

In various aspects, exemplary methods include arranging a base mixture including copper, such as copper nanoparticles, in a die mold. The methods include arranging a secondary mixture including a silica based inorganic material, such as silica nanoparticles, on top of the base mixture. The methods further include heating and compressing the base mixture and the secondary mixture in the die mold at a temperature, a pressure, and a time sufficient to sinter and fuse the base mixture with the secondary mixture to form a monolithic substrate defining a first major surface providing thermal conductivity, and a second major surface providing an electrically resistive surface. An electronic component can then be mounted to the second major surface that prevents electrical shorting across the second surface, while other regions of the monolithic substrate provide superior thermal conductivity to remove heat away from the electronic component(s).

Figure 1:
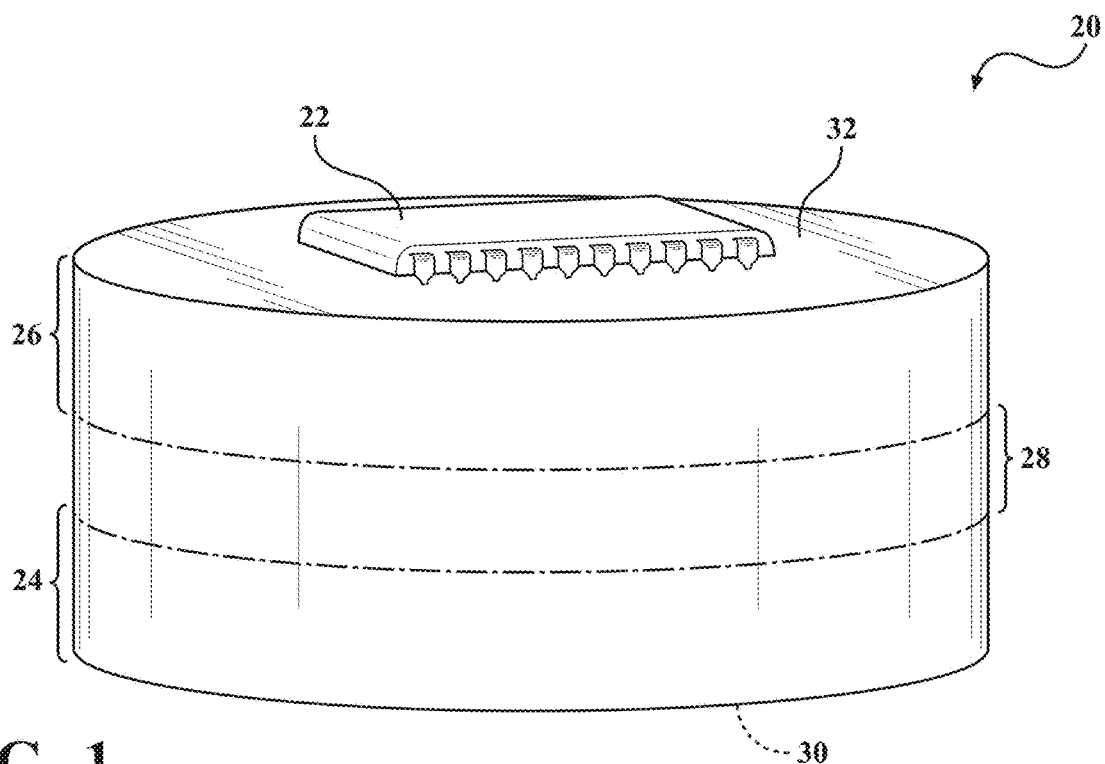
FIG. 1 illustrates an exemplary monolithic substrate for coupling with an electronic component according to various aspects of the present technology.

FIG. 1 illustrates an exemplary monolithic substrate 20 for coupling with an electronic component 22 according to various aspects of the present technology. As used herein, the term "electronic component" is not meant to be limiting and can include various electronic circuits, integrated circuits, and chips as are known in the art. Generally, the electronic component 22 can be any basic or discrete device for use in an electronic system used to affect electrons and/or their associated fields. The electronic component 22 can include any number of leads, lead wires, or electrical terminals; it can be active, passive, or electromagnetic.

Although shown as a substantially circular and cylindrical component in FIG. 1, it should be understood that the monolithic substrate 20 may be provided with any shape, size, and dimensions suitable for the ultimate purpose and intended use. As shown, the monolithic component 20 may include a base region 24 that includes the bulk copper, and a secondary region 26, shown as an upper portion in this particular orientation, including the silica based inorganic material. The area between the base region 24 and the secondary region 26 may be referred to as an interface region 28. The interface region 28 is the location where the two different components of the substrate are substantially fused and/or bonded together. Although shown in the center region, it should be understood that the fusion and bonding can occur at various depths and locations relative to the monolithic substrate 20 itself.

The base region 24 may generally define a first major surface 30 that is exposed and thermally conductive. The secondary region 26 may generally define a second major surface 32 that is exposed and provides a high level of electrical resistance, which can be referred to as an electrically resistive surface. Since the secondary region 26 includes a silica based inorganic material, the second major surface may substantially or completely defines an $SiO_2$ surface. Although shown as substantially planar surfaces in FIG. 1, the first and second major surfaces 30, 32 may be shaped, curved, etc. Still further, although the first and second major surfaces 30, 32 are illustrated as generally being parallel and on opposing sides of the monolithic substrate 20, this particular orientation is just one exemplary design. The monolithic substrate 20 may be provided with numerous additional defined surfaces or areas. In various aspects, the first major surface 30 may be shaped or machined to provide various thermal dissipation features in order to assist with a transfer of heat. For example, at least a portion of the first major surface may be provided with a plurality of grooves or cooling fins machined therein (not shown). Alternatively, grooves or fins may be defined based on a shape of the die mold and/or die components. In these instances, the first major surface 30 may be considered to be discontinuous, or having a non-uniform surface.

The thickness of each region 24, 26 may vary, as well as the thickness of the interface region 28, based on the design and intended use of the monolithic substrate 20.

In one non-limiting example, samples can be made with a copper thickness of about 2 mm, and a thickness of silica of about 0.5 mm. It will be understood that the silica should be thick enough to be electrically insulating over the scale of the presented surface, which in certain aspects may be greater than about 0.25 mm. Generally, the copper can be as thick as desired, such that it still gives good thermal conductivity.

In certain aspects, the present technology contemplates using the monolithic substrate 20 functionally as part of, or even as an entirety of, a circuit board. For example, a circuit board or power electronics device with an integral heat sink. As such, once formed, or alternatively during the formation process, the monolithic substrate 20 may be provided with various conductive and non-conductive tracks, pads, and other features useful for functioning as a circuit board, power electronics device, or portion thereof.

Figure 2:
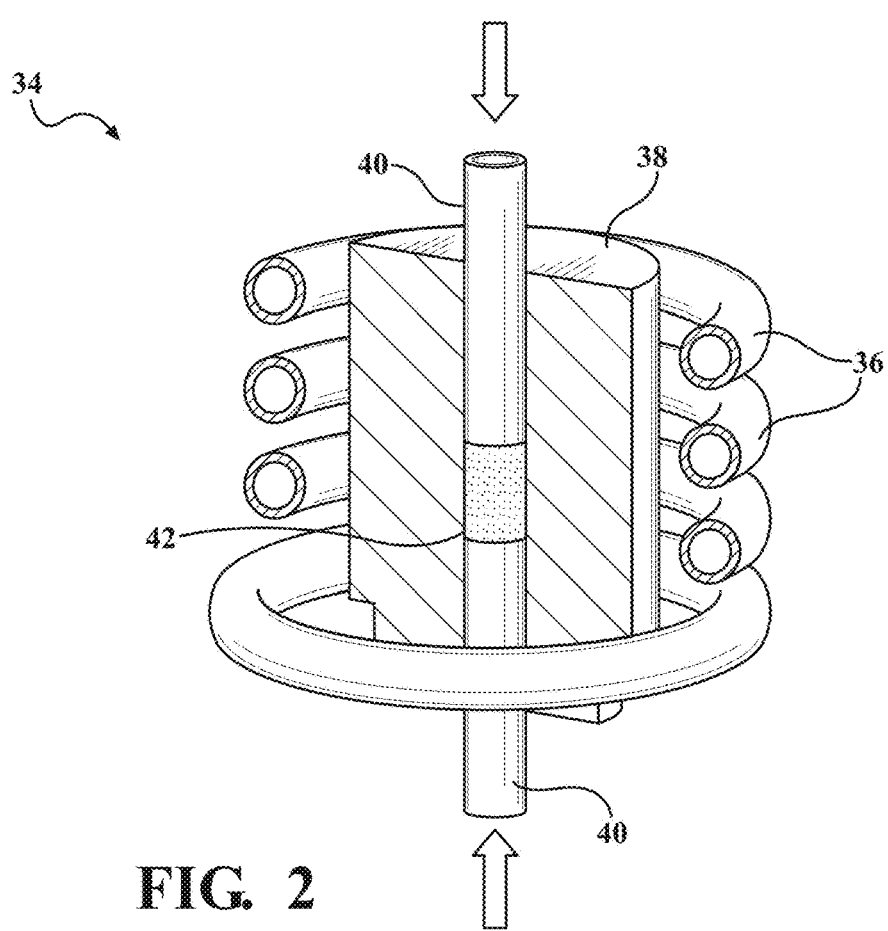
FIG. 2 is a partial cross-sectional illustration of an exemplary die mold with a heating element.

FIG. 2 is a partial cross-sectional illustration of an exemplary die mold 34 with a heating element specifically shown as a heating coil 36. The shape and type of the die mold 34 and heating unit may vary based on the ultimate design, purpose, and intended use for the monolithic substrate 20. As shown, the die mold 34 includes a main body portion 38 of a suitable material that cooperates with opposing presses 40, or hydraulic elements, to create and define an internal cavity 42 having a shape of the formed and compressed monolithic substrate 20. In various aspects, the die mold 34 may be configured with the appropriate features for use in a hot pressing or hot press sintering formation process, and the components including the main body portion 38 and presses 40 will be configured to withstand high heat and high pressure as required. Punches may also be provided in the die mold.

Hot pressing, or hot press sintering, is a relatively high pressure, low strain process useful with powder metallurgy, ultimately arranging and forming powder compacts that are subjected to a simultaneous application of heat and pressure for a time sufficient to induce sintering and/or creep processes. As is known, the heating can be accomplished using inductive heating, indirect resistance heating, direct current (spark plasma sintering or SPS), and field assisted sintering techniques (FAST). The die mold of FIG. 2 is an example of the use of conventional inductive heating. The molding process may be performed under vacuum or in a controlled atmosphere, for example, using a gas such as argon. Indirect resistance heating may also be useful with the present technology.

Figure 3A:
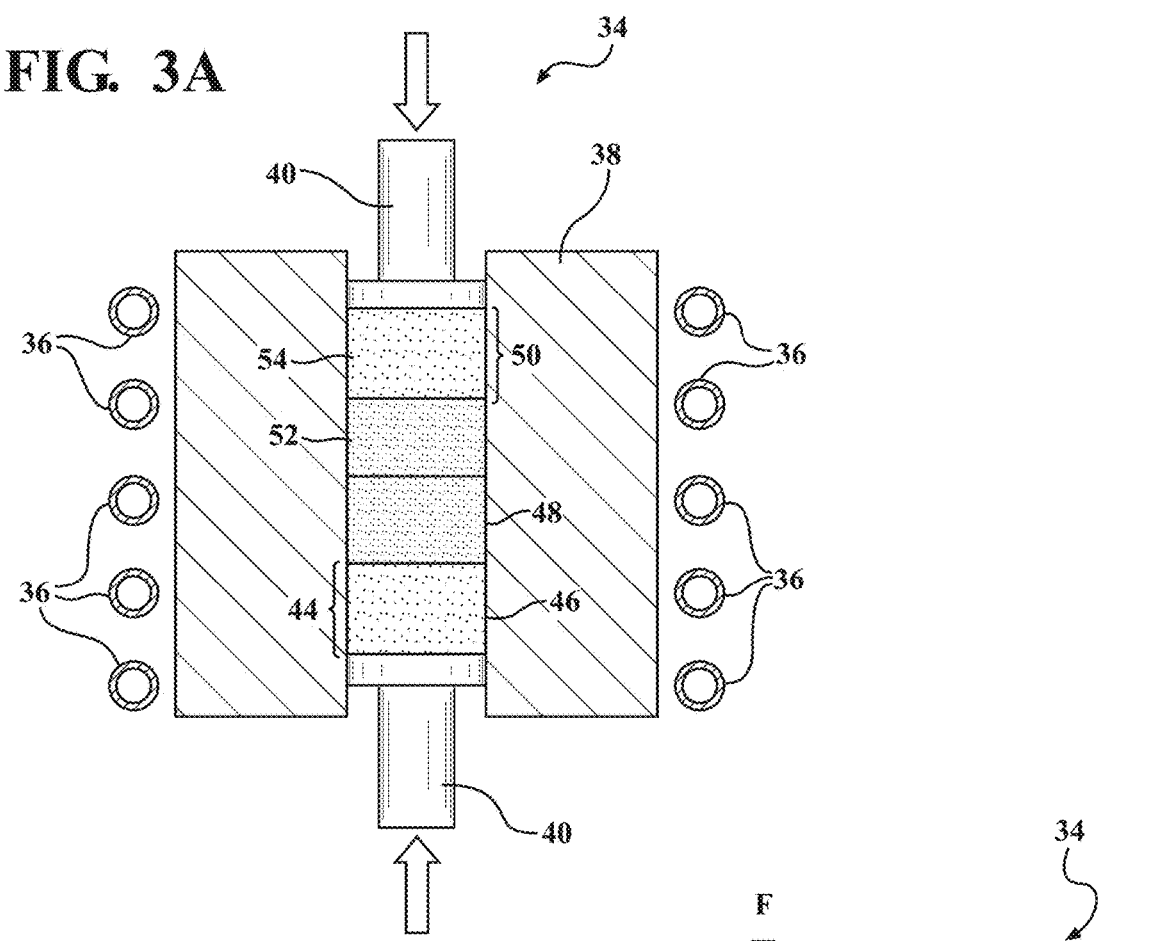
FIG. 3A is a cross-sectional view of the die mold of FIG. 2 illustrating a plurality of layered materials prior to heating and compression.
Figure 3B:
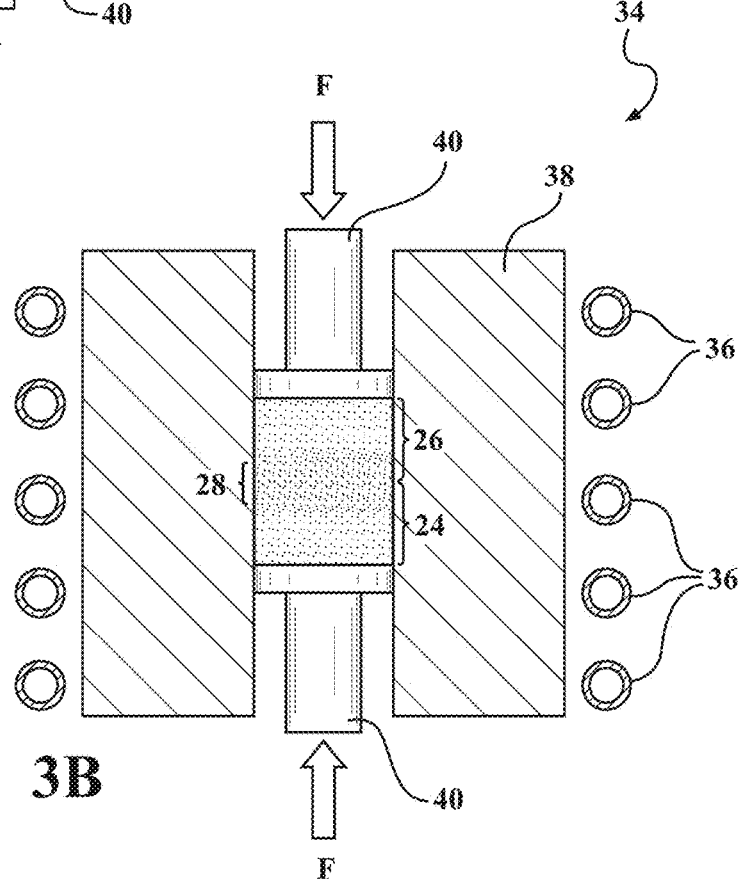
FIG. 3B is a cross-sectional view of the die mold of FIG. 2 illustrating a compression of the layered materials of FIG. 3A.

FIG. 3A is a cross-sectional view of the die mold of FIG. 2 illustrating a plurality of layered materials prior to heating and compression. FIG. 3B is a cross-sectional view of the die mold of FIG. 2 illustrating a compression of the layered materials of FIG. 3A, ultimately forming the monolithic substrate 20. With reference to FIG. 3A, the methods for making the monolithic substrate may include arranging a base mixture 44 in the die mold 34 that will subsequently form the first region 24 of the monolithic substrate 20. The base mixture 44 may include a bottom portion 46 including a copper powder of a first particle size dimension of −325 mesh, and an upper portion 48 including a copper powder of a second particle size dimension, which may be smaller than the first particle size dimension at 5 nm. In various aspects, for example, the bottom portion 46 may include a copper micron powder ranging in size from 3 to 35 microns, and the upper portion 48 may include copper nanoparticles ranging in size from 3 to 20 nm. While only shown with two portions 46, 48, additional portions or layers may be provided. Generally, the portions will provide a gradient with respect to particle size of the copper. In various aspects, within the distinct portions 46, 48, the copper may have a substantially similar particle size, while in other aspects, the particles sizes can be mixed. In still other aspects, the bottom most portion may be provided with a copper foil, or a solid piece of copper having a defined thickness.

The methods for making the monolithic substrate may then proceed with arranging a secondary mixture 50 in the die mold 34 on top of the base mixture 44 that will subsequently form the second region 26 of the monolithic substrate 20. The secondary mixture 44 may include a bottom portion 52 including a first silica based inorganic material, and an upper portion 54 including a second silica based inorganic material. In various aspects, the bottom portion 52 may include silica-coated copper nanoparticles that are the previously discussed copper nanoparticles, now with about 4 nm thick silica shells, and the upper portion 54 may include silica nanoparticles that are from about 5 to about 15 nm in diameter. Additionally or alternatively, the bottom and upper portions 52, 54 may be provided with silica particles having a different particles size, preferably with the smaller particle size placed adjacent the copper particles. While only shown with two portions 52, 54, additional portions or layers may also be provided. Similar to the base mixture 44, the secondary mixture 50 can be provided with portions that ultimately provide a gradient with respect to particle size of the silica material. In various aspects, the distinct portions 52, 54 may have a substantially similar particle size, while in other aspects, the particles sizes can be mixed. In various aspects, the interface layer between copper and silica (shells and not) can be mixed-and-matched.

Once arranged in the die mold 34, the methods may include heating and compressing contents of the die mold, including the base mixture 44 and the secondary mixture 50 at a temperature, a pressure, and for a time sufficient to sinter and fuse the base mixture 44 with the secondary mixture 50 to form the monolithic substrate 20 with a base region 24 and a secondary region 26. In various examples, the contents of the die mold 34 may be heated to a temperature of between about 375° C. to about 500° C., between about 425° C. to about 475° C., or at about 450° C. The contents of the die mold 34 may be compressed to a pressure of between about 35 MPa to about 45 MPa, or about 40 MPa. The specific combination of temperature, pressure, and time can vary depending on the materials used and ultimate strength desired. In one specific example, the contents of the die mold 34 may be heated to a temperature of about 450° C. at a pressure of about 40 MPa, for a period of time of about one hour. The increase in temperature and pressure can be obtained through gradual increases or in a series of step increases/intervals ultimately leading to the sintering and fusing/bonding phases.

In various aspects, this hot pressing, or hot press sintering, forms an interface region 28 that is disposed between the base and secondary regions 24, 26 and includes copper nanoparticles sintered and fused with silica-coated copper nanoparticles to form a high strength bond between the two materials. The remainder of the base region 24 may be referred to as bulk copper that serves as a thermal conductor. The remainder of the secondary region 26 may be referred to as the silica component that ultimately provides the electrically resistive portion and surface of the monolithic substrate. In various aspects, the secondary region 26 may be substantially thinner than the base region 24, since the ultimate purpose of the secondary region is mainly to provide the electrically resistive surface. The thickness of the base region 24 may be dependent on the amount of heat transfer that may be required.

Figure 4:
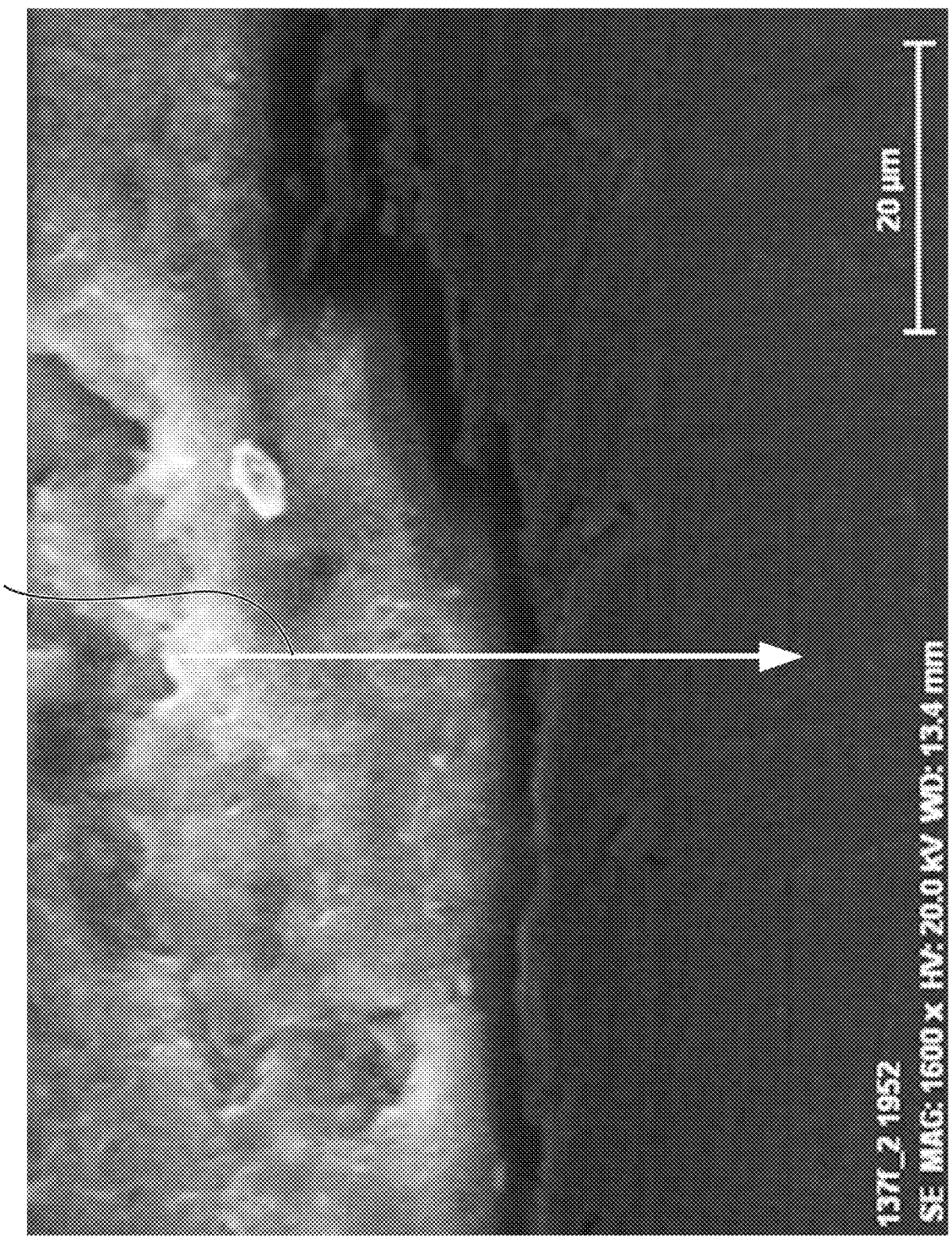
FIG. 4 is Scanning Electron Microscopy/Energy Dispersive X-Ray Spectroscopy (SEM-EDS) cross-section of an exemplary monolithic substrate with a first region including $SiO2$ and a second region including bulk copper.
Figure 5:
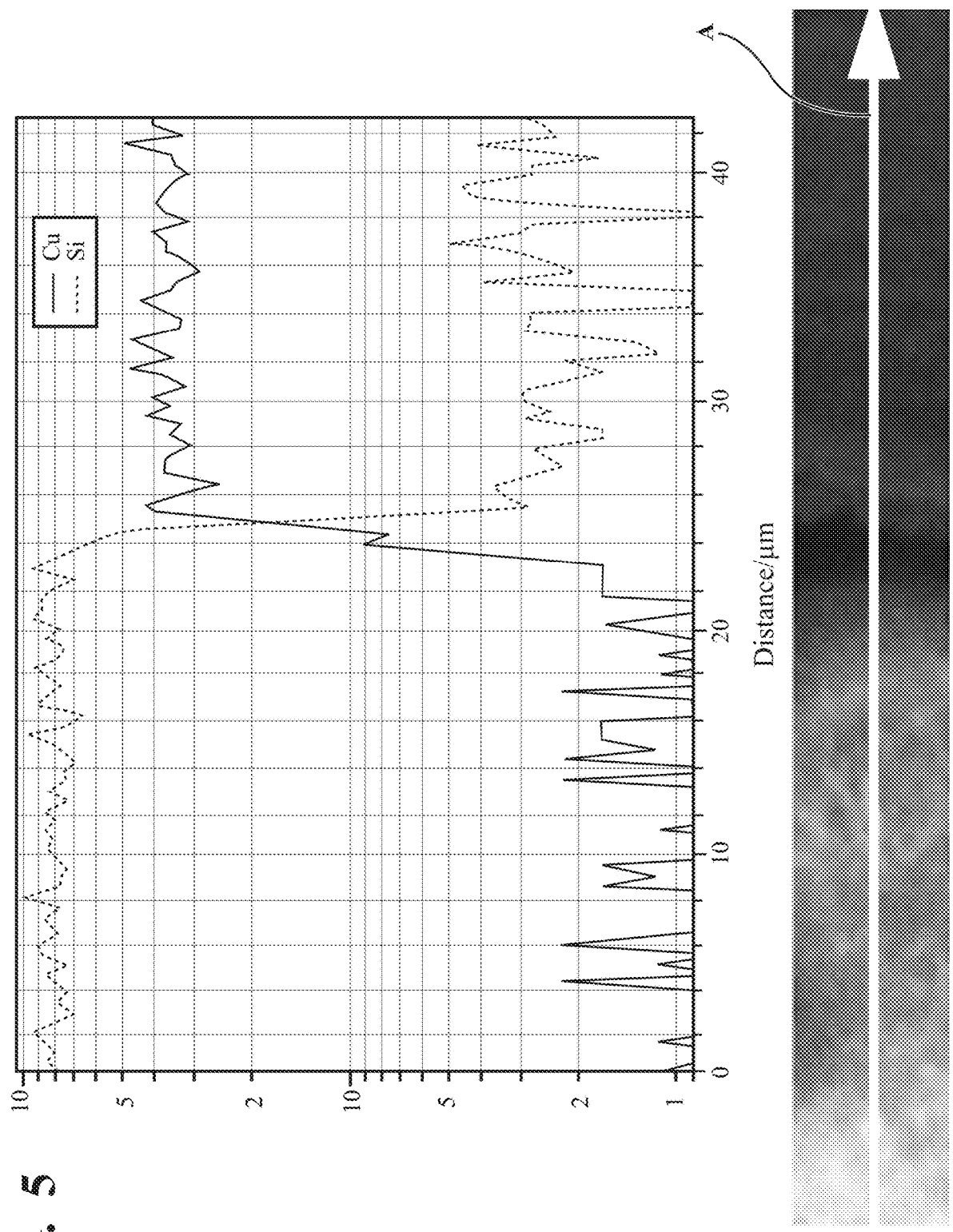
FIG. 5 is a plot illustrating the SEM-EDS line profile through the exemplary monolithic substrate indicating an intensity of the presence of copper and silica across a depth of the monolithic substrate.

FIG. 4 is Scanning Electron Microscopy/Energy Dispersive X-Ray Spectroscopy (SEM-EDS) cross-section of an exemplary monolithic substrate with a first region including $SiO_2$ and a second region including bulk copper. FIG. 5 is a plot illustrating the SEM-EDS line profile through the exemplary monolithic substrate indicating an intensity of the presence of copper and silica across a depth (arrow "A") of the monolithic substrate. At least a portion of the silica appears to diffuse into the base region 24, and at least a portion of the copper appears to diffuse into the secondary region 26 of the monolithic substrate 20.

In various aspects, the second major surface 32 of the monolithic substrate 20 provides an electrically insulating surface that exhibits an electrical resistivity of greater than about $1 \times 10^6$ S/cm. It should be noted that this is the electrical resistivity of the silica surface side of the composite. As used herein, electrical resistivity is a measurement that quantifies how strongly a given material opposes the flow of electric current. A lower resistivity generally indicates that a material or a surface of a material easily permits the flow of current, thus, the larger the resistivity, the better.

In various aspects, the base region 24 and the first major surface 30 of the monolithic substrate provide heat transfer functionality and exhibit a thermal conductivity of greater than about 180 W/mK at 30° C. As used herein, thermally conductive refers to a property of a material to conduct heat. In the present application, this is the thermal conductivity from the silica surface, through the composite, and out the copper side. A higher thermal conductivity generally indicates heat transfer at a higher rate, thus the higher thermal conductivity, the better.

The foregoing description is provided for purposes of illustration and description and is in no way intended to limit the disclosure, its application, or uses. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations should not be regarded as a departure from the disclosure, and all such modifications are intended to be included within the scope of the disclosure.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range, including the endpoints.

The headings (such as "Background" and "Summary") and sub-headings used herein are intended only for general organization of topics within the present disclosure, and are not intended to limit the disclosure of the technology or any aspect thereof. The recitation of multiple embodiments having stated features is not intended to exclude other embodiments having additional features, or other embodiments incorporating different combinations of the stated features.

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that an embodiment can or may comprise certain elements or features does not exclude other embodiments of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one aspect, or various aspects means that a particular feature, structure, or characteristic described in connection with an embodiment or particular system is included in at least one embodiment or aspect. The appearances of the phrase "in one aspect" (or variations thereof) are not necessarily referring to the same aspect or embodiment. It should be also understood that the various method steps discussed herein do not have to be carried out in the same order as depicted, and not each method step is required in each aspect or embodiment.

What is claimed is:

1. A monolithic substrate for coupling with an electronic component, the monolithic substrate comprising:
   a first region defining a first surface comprising copper;
   a second region comprising a silica based inorganic material and defining a second surface provided with an electrically resistive surface; and
   an interface region disposed between the first region and the second region, wherein the interface region includes copper nanoparticles sintered and fused together with silica-coated copper nanoparticles having diameters in the range from 3 nm to 20 nm inclusive, and wherein the silica-coated copper nanoparticles have silica shells with thicknesses of about 4 nm.

2. The monolithic substrate according to claim 1, wherein the first surface is shaped to provide thermal dissipation features.

3. The monolithic substrate according to claim 2, wherein the first surface comprises a plurality of cooling fins machined therein.

4. The monolithic substrate according to claim 1, wherein the first surface of the monolithic substrate exhibits a thermal conductivity of greater than about 180 W/mK.

5. The monolithic substrate according to claim 1, wherein the second surface of the monolithic substrate exhibits an electrical resistivity of greater than about $1 \times 10^6$ s/cm.

6. A circuit board comprising the monolithic substrate according to claim 1.

7. A monolithic substrate for coupling with an electronic component, the monolithic substrate comprising:
   a first region defining a first surface comprising copper;
   a second region comprising a silica based inorganic material and defining a second surface provided with an electrically resistive surface; and
   an interface region disposed between the first region and the second region, wherein the interface region comprises a first portion comprising copper nanoparticles coated with silica shells, the copper nanoparticles having diameters in the range from 3 nm to 20 nm inclusive, wherein the first region is bonded to the first portion of the interface region.

8. The monolithic substrate according to claim 7, wherein the second region comprises silica nanoparticles that are from about 5 nm to about 15 nm in diameter, and the second surface defines a $SiO_2$ surface.

9. The monolithic substrate according to claim 7 wherein the interface region first portion is sintered and fused with a second portion comprising silica nanoparticles, and wherein the second region is bonded to the second portion of the interface region.

* * * * *